US009766273B2

(12) United States Patent
Nguyen

(10) Patent No.: US 9,766,273 B2
(45) Date of Patent: Sep. 19, 2017

(54) SELF-POWERED CURRENT SENSOR WITH A LINEAR ADJUSTMENT

(75) Inventor: Huy D. Nguyen, Tracy, CA (US)

(73) Assignee: Neilsen-Kuljian, Inc., San Jose, CA (US)

( * ) Notice: Subject to any disclaimer, the term of this patent is extended or adjusted under 35 U.S.C. 154(b) by 260 days.

(21) Appl. No.: 13/591,130

(22) Filed: Aug. 21, 2012

(65) Prior Publication Data

US 2014/0055151 A1 Feb. 27, 2014

(51) Int. Cl.
G01R 27/08 (2006.01)
G01R 15/14 (2006.01)
H02H 3/00 (2006.01)
H02H 3/08 (2006.01)
H02H 1/06 (2006.01)
G01R 1/30 (2006.01)
G01R 35/00 (2006.01)

(52) U.S. Cl.
CPC .......... G01R 15/146 (2013.01); H02H 3/006 (2013.01); H02H 3/08 (2013.01); *G01R 1/30* (2013.01); *G01R 35/005* (2013.01); *H02H 1/06* (2013.01)

(58) Field of Classification Search
CPC G01D 11/245; G01R 17/105; G01R 19/0092; G01R 31/2829; B65H 2553/21; H01C 10/00
USPC ......... 324/714, 124, 127, 128; 361/24, 93.2, 361/93.4
See application file for complete search history.

(56) References Cited

U.S. PATENT DOCUMENTS

| 4,297,587 | A | * | 10/1981 | Baker | ...................... | 250/559.49 |
| 4,321,530 | A | | 3/1982 | Kelly et al. | | |
| 4,321,591 | A | * | 3/1982 | Vieweg | ................ | G08B 19/005 340/514 |
| 4,346,307 | A | * | 8/1982 | Zulaski | .................. | H02H 3/253 307/130 |
| 4,454,557 | A | * | 6/1984 | Hurley | ................. | G01R 15/005 324/127 |
| 4,504,778 | A | * | 3/1985 | Evans | ................. | H02M 5/2573 323/321 |

(Continued)

FOREIGN PATENT DOCUMENTS

| EP | 1 970 716 A2 | 9/2008 |
| WO | 2013/184421 A1 | 12/2013 |
| WO | 2014/031688 A1 | 2/2014 |

OTHER PUBLICATIONS

NK Technologies, "ASXP Series Current Sensing Switches", http://www.nktechnologies.com/current-sensing-switch/asxp-current-switch.html (last visited 2012), p. 1.

(Continued)

*Primary Examiner* — Giovanni Astacio-Oquendo
(74) *Attorney, Agent, or Firm* — Nixon Peabody LLP

(57) ABSTRACT

A self-powered current sensor is described. The self-powered current sensor including an electrical signal input configured to receive a current signal. Further, the self-powered current sensor includes a power circuit configured to generate a power voltage from an electrical signal. The self-powered current sensor also includes a variable resistor configured to set a value corresponding to one or more indicators on the electrical sensor and an amplifier coupled with a variable resistor and a power circuit. And, the self-powered current sensor includes an alarm coupled with an amplifier, an alarm configured to activate based on a value set by said variable resistor.

19 Claims, 5 Drawing Sheets

(56) References Cited

U.S. PATENT DOCUMENTS

| | | | | |
|---|---|---|---|---|
| 4,558,310 A | * | 12/1985 | McAllise | 340/661 |
| 4,728,898 A | * | 3/1988 | Staley, Jr. | G01R 19/16571 324/133 |
| 4,866,557 A | | 9/1989 | Fitts et al. | |
| 5,179,495 A | * | 1/1993 | Zuzuly | 361/94 |
| 5,450,268 A | | 9/1995 | Phillips et al. | |
| 5,598,315 A | * | 1/1997 | Phillips | H02H 1/0007 361/18 |
| 5,668,692 A | * | 9/1997 | Rodgers et al. | 361/93.4 |
| 5,920,191 A | * | 7/1999 | Maniero | G01R 19/15 219/486 |
| 5,995,347 A | * | 11/1999 | Rudd et al. | 361/24 |
| 6,018,700 A | | 1/2000 | Edel | |
| 6,043,641 A | * | 3/2000 | Singer | G01R 15/181 324/115 |
| 6,118,270 A | * | 9/2000 | Singer | G01R 15/181 324/115 |
| 6,141,198 A | | 10/2000 | Zuzuly | |
| 6,147,847 A | * | 11/2000 | Hochgraef et al. | 361/93.2 |
| 6,512,361 B1 | * | 1/2003 | Becker | G01R 1/06788 324/133 |
| 7,310,049 B2 | * | 12/2007 | Bowman | G01R 31/343 324/127 |
| 7,615,989 B2 | * | 11/2009 | Kojori | 324/127 |
| 7,742,273 B1 | * | 6/2010 | Shvartsman et al. | 361/160 |
| 7,907,375 B2 | | 3/2011 | Blakely et al. | |
| 2005/0017734 A1 | | 1/2005 | Gemme et al. | |
| 2008/0017726 A1 | * | 1/2008 | Neumann | 237/2 A |
| 2009/0122453 A1 | | 5/2009 | Vicente et al. | |
| 2009/0284250 A1 | * | 11/2009 | Rittmann | 324/130 |
| 2009/0315568 A1 | * | 12/2009 | Holce | G01R 31/343 324/555 |
| 2010/0001716 A1 | * | 1/2010 | Serpinet | G01R 15/207 324/117 R |
| 2010/0085036 A1 | | 4/2010 | Banting et al. | |
| 2010/0308797 A1 | | 12/2010 | Zimmermann | |
| 2012/0176120 A1 | | 7/2012 | Jefferies | |
| 2013/0328687 A1 | | 12/2013 | Nguyen et al. | |
| 2014/0354439 A1 | | 12/2014 | Nguyen et al. | |

OTHER PUBLICATIONS

NK Technologies, "ASXP Series Current Operated Switches", Rev. 7.12c, http://www.nktechnologies.com/current-sensing-switch/datasheet/asxp-current-switch.pdf (last visited 2012), pp. A20-A21.

NK Technologies, "ASXP Instruction Sheet", Rev 4, 07-12 P/N 394100001, http://www.nktechnologies.com/current-sensing-switch/instructionsheet/asxp-current-switch.pdf (last visited 2012), pp. 1-2.

International Search Report and Written Opinion in International Application No. PCT/US2013/055863, mailed Jan. 29, 2014.

International Search Report and Written Opinion in International Application No. PCT/US2013/042775, mailed Oct. 31, 2013.

Extended European Search Report in European Application No. 13800640.8, dated Aug. 11, 2015.

Extended European Search Report in European Application No. 13831509.8, dated Aug. 6, 2015.

Office Action in U.S. Appl. No. 13/492,752, mailed May 21, 2014.

Office Action in U.S. Appl. No. 13/492,752, mailed Oct. 15, 2014.

Office Action in U.S. Appl. No. 13/492,752, mailed Jun. 19, 2015.

Notice of Allowance in U.S. Appl. No. 13/492,752, mailed Dec. 30, 2015.

Office Action in U.S. Appl. No. 13/492,752, mailed May 3, 2016.

Office Action in U.S. Appl. No. 14/226,758, mailed Feb. 26, 2016.

Office Action in U.S. Appl. No. 13/492,752, mailed Nov. 7, 2016.

Office Action in U.S. Appl. No. 14/226,758, mailed Aug. 26, 2016.

Notice of Allowance in U.S. Appl. No. 13/492,752, mailed Jan. 23, 2017.

Corrected Notice of Allowance in U.S. Appl. No. 13/492,752, dated Apr. 13, 2017.

Notice of Allowance in U.S. Appl. No. 14/226,758, dated May 4, 2017.

\* cited by examiner

SELF-POWERED CURRENT SENSOR WITH A LINEAR ADJUSTMENT

FIELD

Embodiments of the invention relate to current sensors. In particular, embodiments of the invention relate to current sensors with a linear adjustment.

BACKGROUND

Self-powered electrical sensors are used to detect and monitor one or more characteristics of an electrical signal in a conductor. As such, self-powered electrical sensors can be used in systems to monitor current levels, voltage levels, power levels, or other aspects of an electrical system. Monitoring one or more electrical signals in an electrical system provides information on the operating conditions of the system, a subsystem, or one or more components in the system. For example, a self-powered current sensor may be used in control systems in manufacturing and industrial applications. In such applications, a self-powered current sensor may be used to monitor equipment status, to detect process variations, and to ensure safety of personnel. In addition, a self-powered current sensor may be used to control pumps, compressors, heaters, conveyors, and other electrically powered devices.

Some self-powered current sensors are equipped with an alarm that is activated upon a current in a conductor reaching a certain magnitude. The alarm trip point is set based on an adjustment. Deriving power from the electrical signal that the self-powered current sensor is monitoring prevents present self-powered current sensors from including certain functionality. For example, present self-powered current sensors include an adjustment to set a trip-point value for an alarm with a non-linear response over the range of the adjustment. Because the adjustment has a non-linear response the exact value of the adjustment cannot be easily determined. As such, an installer must set a trip point using the non-linear adjustment and then test the current sensor to ensure the trip point is set at the correct value.

So, once the self-powered current sensor has been manually adjusted, the present self-powered current sensors must be tested. The testing requires shutting a system down to adjust the sensor manually and turning the system back on to verify that the sensor had been adjusted to the proper setting. This is repeated until the self-powered current sensor is properly configured. Alternatively, the self-powered current sensor can be calibrated off site but the system still must be shut down to reinstall the current sensor and must again be verified that it is configured properly, which includes turning the system back on and if necessary shutting it down again to reconfigure the electrical sensor. Such a process of adjusting and testing present self-powered current sensors creates extended down time for a system and adds to the cost of running the system.

The correct trip-point value must be set appropriately to ensure that the alarm on a self-powered current sensor trips at a desired value to ensure equipment or a process is operating as required. Failure of an alarm to trip at the right value can result in damage to equipment, injury to personnel, or inefficiencies in a process. Any of these would result in negative consequences and add significant costs.

SUMMARY

A self-powered current sensor is described. The self-powered current sensor including an electrical signal input configured to receive a current signal. Further, the self-powered current sensor includes a power circuit configured to generate a power voltage from an electrical signal. The self-powered current sensor also includes a variable resistor configured to set a value corresponding to one or more indicators on the electrical sensor and an amplifier coupled with a variable resistor and a power circuit. And, the self-powered current sensor includes an alarm coupled with an amplifier, an alarm configured to activate based on a value set by said variable resistor.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of a self-powered electrical sensor are described. In particular, a self-powered current sensor is described that is configured to enable setting a trip point of an alarm based on visual indicators without the need to calibrate the electrical sensor or verify the setting. According to an embodiment, the self-powered electrical sensor includes one or more linear adjustments to set a value of a configuration setting including, but not limited to, a trip-point value for an alarm and a delay time of an alarm based on the visual indicators located on the electrical sensor. A user may select the desired setting without the need to recalibrate or to verify that the configuration settings are at the desired value. This reduces the labor necessary to install or configure such a device. Thus, embodiments of the self-powered current sensor provide ease of use, cost savings, and time savings over prior art sensors.

Embodiments of a self-powered current sensor using techniques described herein enables a linear adjustment to set a configuration setting with the limited power resources of a self-powered current sensor, which has not been possible in previous self-powered current sensors. Further, embodiments of a self-powered current sensor using techniques described herein enable monitoring or detecting changes in an electronic signal having a current magnitude down to as low as approximately 2 amperes. An embodiment of a self-powered current sensor also includes the ability to monitor or detect changes in an electrical signal down to as low as approximately 1 ampere.

Embodiments of a self-powered current sensor include, but are not limited to, a current sensor for measuring or determining characteristics of current signal. Examples of such characteristics of an electrical signal include, but are not limited to, magnitude of a current, an average magnitude of a current during a period of time, peak magnitude of a current over a period of time, minimum magnitude of a current during a period of time, or other aspects of an electrical signal. Such current sensors include, but are not limited to, automation sensors, industrial sensors, and control sensors. According to an embodiment, a current sensor includes a current signal input configured to receive an electrical signal to monitor. Examples of an electrical signal input include a core, a resistive shunt, and other methods to electrically couple with an electrical conductor.

Figure 1:
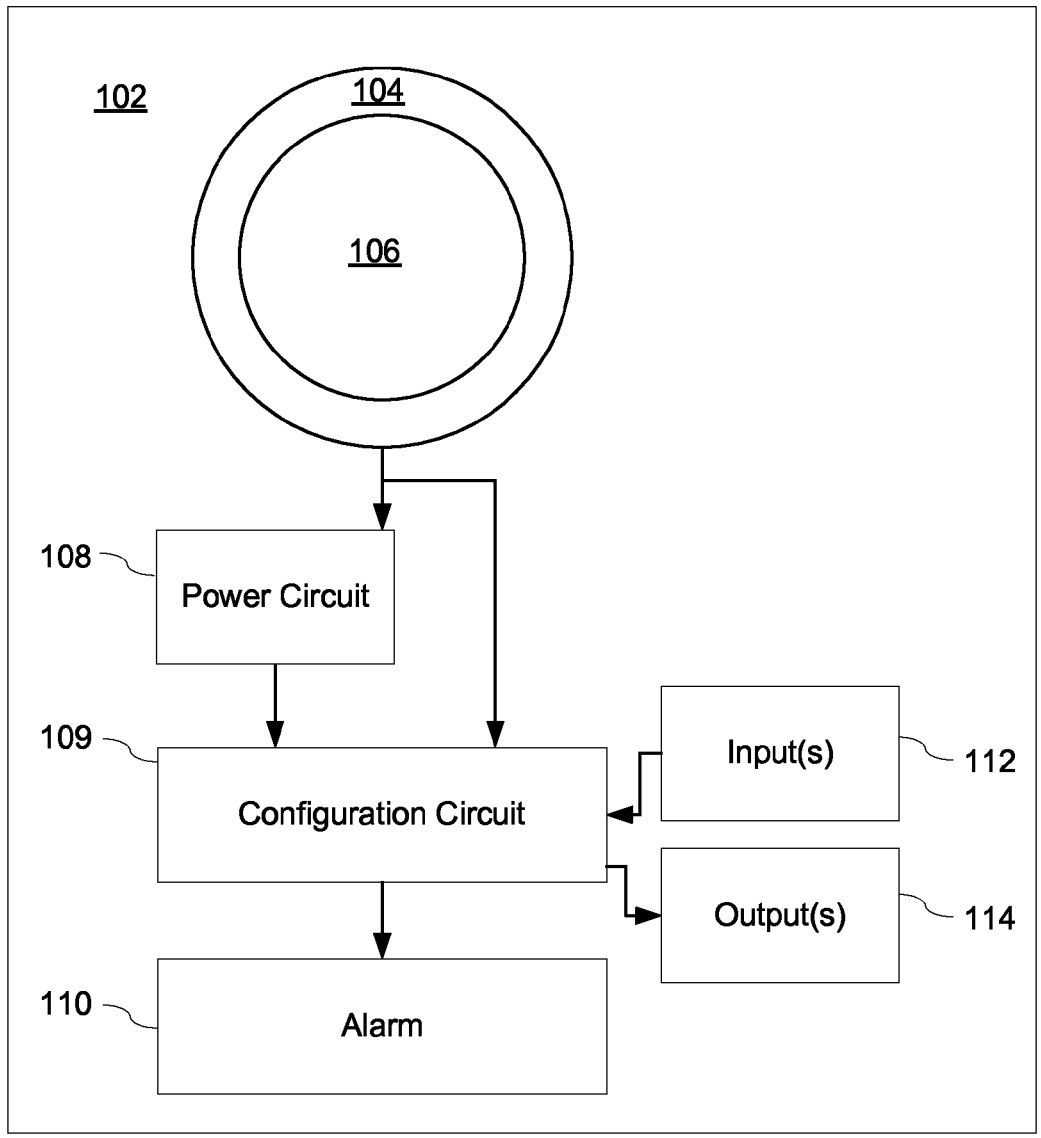
FIG. 1 illustrates a diagram of a self-powered current sensor according to an embodiment.

FIG. 1 illustrates a block diagram of a self-powered current sensor according to an embodiment. A current sensor 102, according to an embodiment, includes a core 104. For an embodiment, a core 104 is made from a magnetically permeable material. For example, a core 104 may be made from ferromagnetic metals, such as iron, ferromagnetic compounds, or other material having a magnetic permeability. According to an embodiment, a core 104 is configured to form a toroid or other shape such that the core 104 defines a sensing aperture 106. A core 104 may be any shape that acts to guide magnetic fields generated by an electrical conductor located in the sensor aperture 106 defined by the core 104.

A core 104, according to an embodiment, is configured such that an electrical conductor may pass through a sensing aperture 106. For some embodiments, a core 104 may be a solid core. That is, the core 104 is one piece such that an electrical conductor can be threaded through a sensor aperture 106. Another embodiment includes a core 104 that is a split core, such that the core 104 may be separated to allow an electrical conductor to be placed within a sensor aperture 106.

A current in an electrical conductor is known to generate a magnetic field. A core 104 acts to magnify a magnetic field generated by an electrical conductor situated in a sensing aperture 106. According to an embodiment, a core 104 may be a wire-wound core. Such a wire-wound core may be used to sense or measure alternating current ("AC") in an electric conductor. For such an embodiment, an electrical conductor generates an alternating magnetic field. A core 104 acts to magnify an alternating magnetic field generated by an electrical conductor. The alternating magnetic field confined in the core 104 generates a current in the wire wound around the wire-wound core. This current can then be used to measure or determine characteristics of a current in an electrical conductor passing through a sensor aperture 106. Characteristics of an electrical signal that can be measured or determined include, but are not limited to, frequency, harmonics, or other characteristics of the electrical signal that can be derived from a current value.

According to an embodiment, the wire-wound core in combination with an electrical conductor passing through a sensor aperture 106 acts as a transformer. The current generated in the wire wound around the wire-wound core is proportional to the current in the electrical conductor according to principles known in the art with regards to transformers. Thus, a current in the electrical conductor situated in a sensor aperture 106, a primary current, may be determined using the corresponding current generated in the wire wound around the wire-wound core, a secondary current. The primary current may be determined by multiplying the secondary current by a multiplication constant. The multiplication constant is determined, as is known in the art, by the characteristics of a core and a number of windings around the core. Alternatively, a multiplication constant may be determined empirically. For example, a primary current of a known magnitude, can be generated in a current conductor passing through a sensor aperture 106 and the corresponding secondary current generated in the wire wound around the wire-wound core may be measured. As such, a multiplication constant may be used that is equal to or based on the ratio of the primary current to the secondary current.

As illustrated in FIG. 1, a current sensor 102, according to an embodiment, includes a power circuit 108 coupled with a core 104. A power circuit 108, according to an embodiment, is configured to generate power for other components or circuits from an electrical signal passing through a core 104. This is in contrast to powered current sensors that require power from external power sources to provide power to components or circuits. According to an embodiment of a power circuit 108 includes one or more components to convert, regulate, or otherwise condition a secondary current generated by a core 104. For example, an embodiment of a power circuit 108 may include one or more components to convert the secondary current generated by a core 104 into a voltage. Further, a power circuit 108 may include components to step up or step down the magnitude of a current or a voltage. Additionally, a power circuit 108 may include one or more components that regulate a current or a voltage at a magnitude to generate a stable power source. A power circuit 108 may also include components to condition a current or a voltage. For example, one or more components or circuits may be used to minimize noise or ripple on an output signal from the power circuit 108. Components used in a power circuit 108 may include, but are not limited to, one or more of any of a resistor, a diode, a capacitor, an inductor, a voltage regulator, a transistor, and an integrated circuit.

The embodiment illustrated in FIG. 1 also includes a configuration circuit 109 coupled with a power circuit 108 and with a core 104. For an embodiment, a configuration circuit 109 receives power generated by a power circuit 108. According to an embodiment, a configuration circuit 109 is configured to include a linear adjustment. Such an embodiment of a configuration circuit 109 is coupled with an input 112. For an embodiment, a current sensor 102 may include one or more inputs 112. An input 112 used as a configuration input may be configured to adjust the operation of a current sensor 102, according to an embodiment. For an embodiment, a configuration input includes one or more adjustments to configure a configuration setting to adjust the operation of a current sensor 102. According to an embodiment, one or more configuration inputs are configured to select a threshold value or a trip-point value for an alarm 110. A configuration input may also select a delay value. For an embodiment, a delay value configures a period of time a current sensor 102 will delay the activation of an alarm after a threshold value or a trip-point value is met or passed. An input 112 includes, but is not limited to, one or more of any of dial, switches, a variable resistor or other interface.

According to an embodiment, a configuration circuit 109 may be coupled with a core 104 through other one or more components that include, but are not limited to, diodes, capacitors, amplifiers, rectifiers or other components to further condition a signal. According to an embodiment, a configuration circuit 109 is coupled with a wire-wound core through one or more conditioning circuits. A conditioning circuit may include for an embodiment, but is not limited to, a rectifier, such as a half-wave rectifier, full-wave rectifier, or other type of rectifier as is known in the art. A configuration output signal generated by a configuration circuit 109, according to an embodiment, may include a current or a voltage that corresponds to the current in the electrical conductor.

A configuration circuit 109 may also include a conditioning circuit to condition a signal received from a coil 104. The configuration circuit 109 may include components including, but not limited to, amplifiers, diodes, resistors, capacitors or other components used alone or in combination to shape, transform, or otherwise alter a signal. For some embodiments, a configuration circuit 109 may include a conditioning circuit that includes one or more burden resistors. For an embodiment, a burden resistor may be used to reduce a magnitude of a current to a range that can be used by other components in a current sensor 102. According to an embodiment including a wire-wound coil, a conditioning circuit includes one or more components that act as a current-to-voltage convertor to transform a current output signal from a coil 104 into a voltage. This voltage can then be used by a configuration circuit 109 to determine a magnitude of a current in the electrical conductor situated in a sensing aperture 106.

For an embodiment, a configuration circuit 109 includes one or more conditioning circuits that include one or more components to scale a signal received from a coil 104. For example, a conditioning circuit may expand a voltage range or current range of the signal received from a coil 104. Another example includes a conditioning circuit that includes components to compress a voltage range or current range of a signal. For an embodiment, a conditioning circuit includes a voltage divider to generate a lower voltage proportional to a voltage received from a coil 104.

According to an embodiment, a configuration circuit 109 generates one or more outputs 114. One such output 114 includes a current output signal that corresponds to the current in the electrical conductor threaded through a sensor aperture 106. According to an embodiment, a configuration circuit 109 may generate a current output signal from the output signal from a coil 104 using one or more conditioning circuits such as those described herein. For an embodiment, a configuration circuit 109 generates a current output that corresponds to a magnitude of a current in an electrical conductor situated in a sensor aperture 106. Another embodiment includes a voltage output that corresponds to a magnitude of a current in an electrical conductor passing through a sensor aperture 106.

According to an embodiment, a configuration circuit 109 is configured to convey information about a current in an electrical conductor situated in a sensor aperture 106 and/or information determined from the current. Examples of such information include, but are not limited to, characteristics of the current such as magnitude, polarity, average magnitude during a period of time, peak magnitude over a period of time, minimum magnitude during a period of time, or other aspects of the current. Examples of information determined from the current include, but are not limited to, frequency, harmonics, or other characteristics that can be determined from a current.

As illustrated in FIG. 1, a configuration circuit 109 is coupled with an alarm 110. According to an embodiment, an alarm 110 is a circuit configured to generate an indication that a current in an electrical conductor passing through a sensor aperture 106 is at or has passed a magnitude. According to an embodiment, a variable resistor is coupled with a feedback loop of an amplifier circuit. For an embodiment, a variable resistor is a potentiometer. Based on a resistant value of the potentiometer, according to an embodiment, a gain or multiplication factor of an amplifier changes. In response, an output of the amplifier changes for a given input. For such an embodiment, the output of an amplifier circuit for a given input is configured based on the value of the configuration input.

According to an embodiment, a configuration circuit 109 is configured to activate an alarm 110 based on a value of a configuration input, such as a trip-point setting. An alarm 110 according to an embodiment is configured to activate upon a configuration output signal from a configuration circuit 109 reaches a value. For an embodiment, a value corresponds to a magnitude of a current in an electrical conductor situated in a sensing aperture 106 being greater than or equal to a value set by a configuration input. For an embodiment, how the current corresponds to the configuration output signal is based on a setting of an input 112. For an embodiment, a variable resistor in a feedback loop of an amplifier adjusts a multiplication factor of an input signal based on a position of a dial or wiper of the variable resistor.

An alarm 110 may include, but is not limited to, a visual indicator, an audible indicator, and an electrical indicator. Examples of a visual indicator include, but are not limited to, an LED, a display, a lamp and other visual indicators that can be visually perceived. Audible indicators may include, but are not limited to, a buzzer, a chime, a bell, and other indictors audibly perceived. Examples of an electrical indicator include, but are not limited to, generating a voltage or a current, activating a relay, switching a voltage or current from one level to another, driving a signal line to a voltage level or current level, and other indications that can be detected electrically.

For an embodiment, an alarm 110 may be an electrical signal used as a control signal. For example, an alarm 110 may be used as part of a control system. As such, the alarm 110 may be used to stop, start, or control the rate of a process or system. According to an embodiment, one or more outputs 114 may be used as a part of control system. For example, a current output that corresponds to a current situated in a sensor aperture 106 may be used to control the rate of a process or a system.

Figure 2:
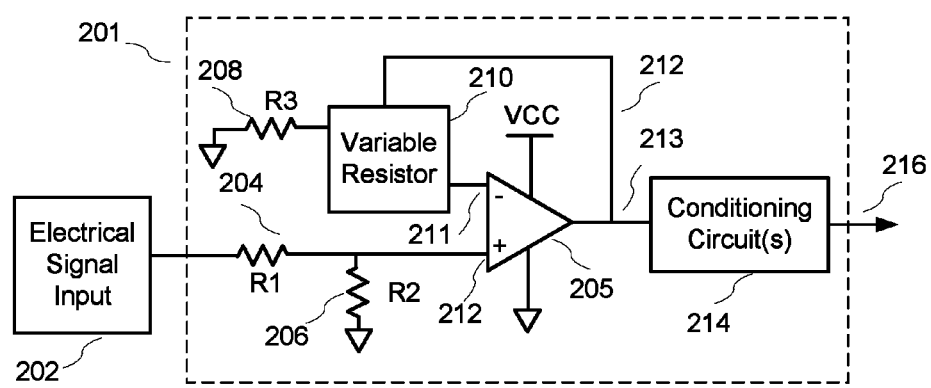
FIG. 2 illustrates a diagram of a configuration circuit coupled with an electrical signal input for a self-powered current sensor according to an embodiment.

FIG. 2 illustrates a diagram of a configuration circuit 201 coupled with an electrical signal input 202 according to an embodiment. As illustrated in the FIG. 2 embodiment illustrates, a configuration circuit 201 includes an amplifier 205. For an embodiment, an amplifier 205 is coupled with a reference voltage, such as a ground plane and a power circuit configured to generate a power voltage such as VCC, as indicated in FIG. 2. An embodiment also includes an amplifier 205 coupled with one or more power circuits to generate a first power voltage and a second power voltage to provide power to the amplifier 205. For an embodiment, an amplifier 205 may include, but is not limited to, an operational amplifier, a differential amplifier, a circuit of one or more transistors, or other circuits for amplifying a signal. An amplifier 205, according to an embodiment, is coupled with an electrical signal input 202 through a voltage divider including a first resistor 204 and a second resistor 206. The first resistor having a resistance value R1 and the second resistor having a resistance R2. For an embodiment, a first resistor 204 and a second resistor 206 are coupled to a non-inverting input 212 of an amplifier 205. According to an embodiment, the resistance value R1 of a first resistor 204 and the resistance value R2 of a second resistor 206 are configured to have values to reduce the voltage received from the electrical signal input. According to an embodiment, a first resistor 204 and a second resistor 206 each may include one or more resistive elements to achieve a resistance value R1 or R2, respectively. Resistive elements include, but are not limited to, one of or a combination of one or more of any of a fixed resistor, a potentiometer, and a rheostat. As such, a resistive element, for example, may be a single fixed resistor or a combination of one or more fixed resistors and a potentiometer to achieve a resistance R1 or R2.

A voltage divider, according to an embodiment, includes a first resistor 204 and a second resistor 206 configured to keep a signal received from electrical signal input 202 within an operating range of an amplifier 205. For an embodiment, a voltage divider is configured to have an output range vary from a range of approximately 0 to 1 volt. Another embodiment includes a voltage divider configured such that the voltage of the output signal varies between approximately 0 to 2.5 volts. Yet another embodiment includes a voltage divider configured such that the voltage of the output signal varies from approximately 2.5 to 5 volts. One skilled in the art would appreciate that the output signal may be designed to have any range of values by using different resistance values for a first resistor 204 and for a second resistor 208 using techniques known in the art.

A configuration circuit 201 according to the embodiment illustrated in FIG. 2 includes an amplifier 205 having a feedback loop 212 that includes a variable resistor 210 coupled with a resistive element 208, such that the amplifier is configured as a linear adjustment. According to an embodiment, a linear adjustment is a configuration setting to set a trip-point value. As discussed above, a resistor 208 may include one or more resistive elements to achieve a resistance R3. For an embodiment, a variable resistor 210 is a potentiometer having three terminals, a counter-clockwise terminal, a wiper terminal, and a clockwise terminal. For such an embodiment, the wiper terminal is coupled with an inverting input 211 of an amplifier 205, the counter-clockwise terminal coupled with a resistor 208, and the clockwise terminal is coupled with the output of the amplifier 205.

For an embodiment, a variable resistor 210 coupled with an amplifier 205 is configured to generate a signal that corresponds to a position of a dial on the variable resistor 210. For example, a variable resistor 210 includes a wiper attached to a dial that varies the resistance of the variable resistor 210 as the position of the dial changes. One such example of a variable resistor 210 is a potentiometer. Having a linear adjustment to set a configuration setting provides a more predictable way to set a value than circuits that use a voltage divider circuit configured with a variable resistor, which results in a non-linear adjustment. The ability to use a linear adjustment to set a configuration setting increases the accuracy of setting such an adjustment to a desired value.

An embodiment may include more than one variable resistor to adjust a configuration setting each coupled with an amplifier in a feedback loop as described herein. For some embodiments a variable resistor 210 may be configured to generate or adjust a current value that corresponds to a position of a dial. For another embodiment, a variable resistor 210 is used to generate or adjust an input voltage value that corresponds to a position of the variable resistor 210. Embodiments of a current sensor may include one or more configuration inputs to set a threshold value, a trip-point value, or a delay value.

For an embodiment, a current sensor may be configured to measure current magnitudes over a range of 40 amperes to 200 amperes. According to another embodiment, a self-powered current sensor may be configured to measure current over a range of 60 amperes to 1200 amperes. For yet another embodiment, a self-powered current sensor may be configured to measure current of a range of 0 to 1200 amperes. Other embodiments include a self-powered current sensor configured to measure a current above 1400 amperes. Thus, one skilled in the art would understand that embodiments of a self-powered current sensor may be configured to measure any magnitude of a current in an electrical conductor.

Figure 3:
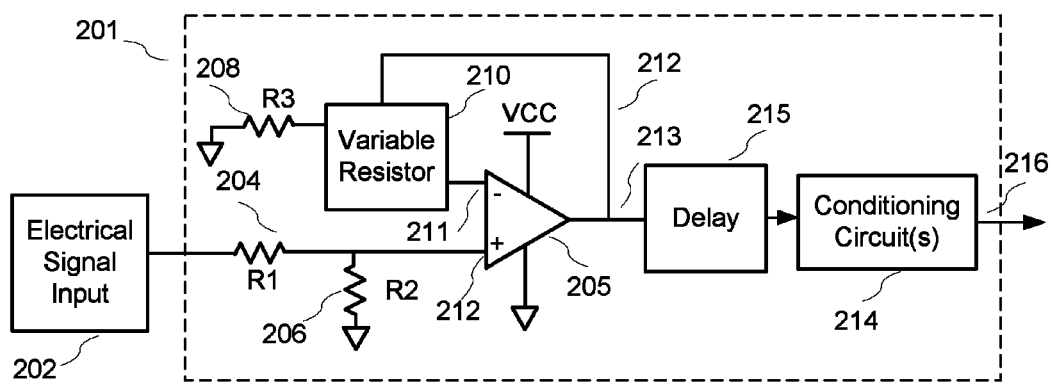
FIG. 3 illustrates a diagram of a configuration circuit including a delay circuit coupled with an electrical signal input for a self-powered current sensor according to an embodiment.

FIG. 3 illustrates a diagram of a configuration circuit including a delay circuit coupled with an electrical signal input for a self-powered current sensor according to an embodiment. According to an embodiment, a configuration circuit 214 includes a delay circuit 215 to delay the activation of an alarm once a trip-point value is measured, as illustrated in FIG. 3. For an embodiment, a delay circuit 215 may include a filter to configure a response time of a configuration circuit to control how quickly a configuration circuit responds to changes in an electrical signal in an electrical conductor. This prevents a configuration circuit from activating an alarm based on changes in an electrical signal that are momentary. For an embodiment, a passive low-pass filter may be implemented using one or more of any of a resistor, a capacitor filter, and an inductor. An embodiment also includes using active filters, digital filters, or other filters known in the art. For an embodiment, a configuration circuit 201 may include a voltage detector coupled with an alarm and configured to delay activation of the alarm.

For embodiments that include a delay circuit 215, the delay circuit 215 prevents an alarm activating based on changes in an electrical signal that have a short duration. This prevents noise in an electrical signal caused by a noisy power supply; a device starting, such as a heater or a motor; or other event that is not of interest to monitor from causing an alarm to activate. For some embodiments a delay circuit 215 is configured to have a delay in a range from 0.5 to 8 seconds. One skilled in the art would understand that any delay value can be used. According to an embodiment, a delay circuit may include a configuration input, such as a variable resistor, to set a value of delay using techniques including those described herein.

A configuration circuit 201, according to an embodiment, is also coupled with an alarm such as an alarm relay. For an embodiment, a configuration circuit 201 may be configured to activate an alarm relay based on a configuration input that sets a trip-point value, as described herein. For another embodiment, an alarm may be one or more transistors configured to turn on to generate a current using techniques known in the art. A configuration circuit 201 generates an alarm signal 216 to activate an alarm, according to an embodiment, when an amplifier output value equals to or is greater than an amplifier output value corresponding to a trip-point setting.

According to an embodiment, a configuration circuit generates a configuration output signal such as an alarm signal 216 based on an amplifier output 213 that is equal to or greater than 0.7 volts. For an embodiment a configuration circuit that generates an alarm signal 216 based on an amplifier output 213 that is approximately 1.2 volts. Yet another embodiment includes a configuration circuit that generates an alarm signal 216 based on an amplifier output 213 that is approximately 5 volts. One skilled in the art would understand that the amplifier output value may be set to any voltage using techniques known in the art.

For an embodiment, adjusting a trip-point setting changes the relationship between the input of the amplifier and the amplifier output value based on the position of the trip-point setting, for example by changing the gain of amplifier 205. Such an alarm signal 216 may be a voltage, a current, or other signal type. According to an embodiment, an amplifier output 213 is coupled with a comparator configured to generate an alarm signal 216 based on a voltage of the amplifier output 213 reaching or exceeding a value. For an embodiment, a comparator may include an operational amplifier configured as a comparator as is know the art. Another embodiment may include one or more transistors configured to generate an alarm signal 216 based on a value of an amplifier output 213. One skilled in the art would understand other components or circuits may be used to generate an alarm signal 216 based on a value of an amplifier output 213.

For an embodiment, a configuration circuit 201 may activate an alarm relay by generating a 5 volt alarm relay signal. According to another embodiment, an alarm relay signal generated by a configuration circuit 201 may be based on a power supply voltage or rail voltage of a component used to generate an alarm relay signal. For such an embodiment, a value of an alarm relay signal may be proportional or dependent on a magnitude of the power supply voltage or rail voltage used to power the component or circuit, such as a comparator, that generates the alarm relay signal. For an embodiment, an alarm relay signal is coupled with an alarm relay. An alarm relay, according to an embodiment, generates an alarm signal 216 that may be used by a control system to indicate that a current level, a voltage level, or a power level in a current conductor has passed a certain threshold, as described herein.

Figure 4:
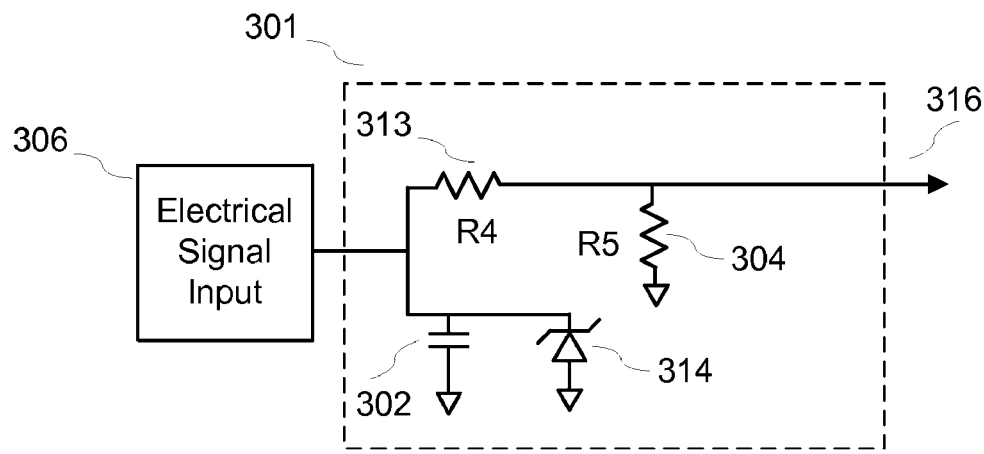
FIG. 4 illustrates a diagram of a power circuit configured to generate power for a self-powered current sensor coupled with an electrical signal input according to an embodiment.

FIG. 4 illustrates a diagram of a power circuit 301 configured to generate power for a self-powered current sensor coupled with an electrical signal input 306 according to an embodiment. For an embodiment, a self-powered current sensor derives all power needed from an electrical signal in an electrical conductor situated in a sensing aperture. As discussed above, a coil generates a secondary current from a primary current in an electrical conductor situated in a sensing aperture. A self-powered current sensor, according to an embodiment uses a secondary current to generate power for the current sensor. As in an embodiment illustrated in FIG. 4, an electrical signal input 306, such as a coil, is coupled with a power circuit. A power circuit 301, according to an embodiment, may include one or more of a zener diode 314 and a capacitor 302 coupled with an electrical signal input 302. A zener diode 314 and/or a capacitor 302 are also coupled with a reference voltage, such as a ground plane.

For an embodiment, one or more of any of a zener diode 314 is used to produce a voltage regulated around a value. For example, more than one zener diode 314 may be used to handle the power requirements of a power circuit. For an embodiment, a zener diode 314 is used to produce a voltage regulated at approximately 15 volts. One skilled in the art would appreciate that one or more of a zener diode 314 may be used to produce any magnitude of voltage using techniques known in the art. A capacitor 302, according to an embodiment, may be used to filter out noise or smooth out a power signal generated by power circuit 301. According to an embodiment, more than one capacitive element may be used to form a first capacitor 302. One skilled in the art would understand that the value of a capacitor is not specifically limited to a specific value and other values could be used.

A power circuit 301, according to an embodiment, may also include one or more voltage dividers to scale an input voltage down to a desired power voltage. For an embodiment, a power circuit may include a first resistor 313 coupled with an electrical signal input 206 and a second resistor 304 to form a voltage divider to generate a power voltage 316. The second resistor 304 is also coupled with a reference voltage such as a ground plane. For the embodiment, the first resistor 313 is configured to have a resistance value R4 and the second resistor 304 is configured to have a resistance value R5. A first resistor 313 and a second resistor 304 may be one or more resistive elements, as discussed herein. Further, the first resistor 313 and the second resistor 304 are configured to reduce an input voltage 307 received from an electrical signal input by a third. For an embodiment, a first resistor 313 is configured to have a resistance value R4 approximately equal to 1 kiloohms and a second resistor 304 is configured to have a resistance value R5 approximately equal to 2 kiloohms. One skilled in the art would understand that any value of resistance may be used to convert an input voltage to another magnitude to generate a power voltage using techniques known in the art. According to an embodiment, a power circuit 301 may include any number of conditioning circuits, such as those described herein.

Figure 5:
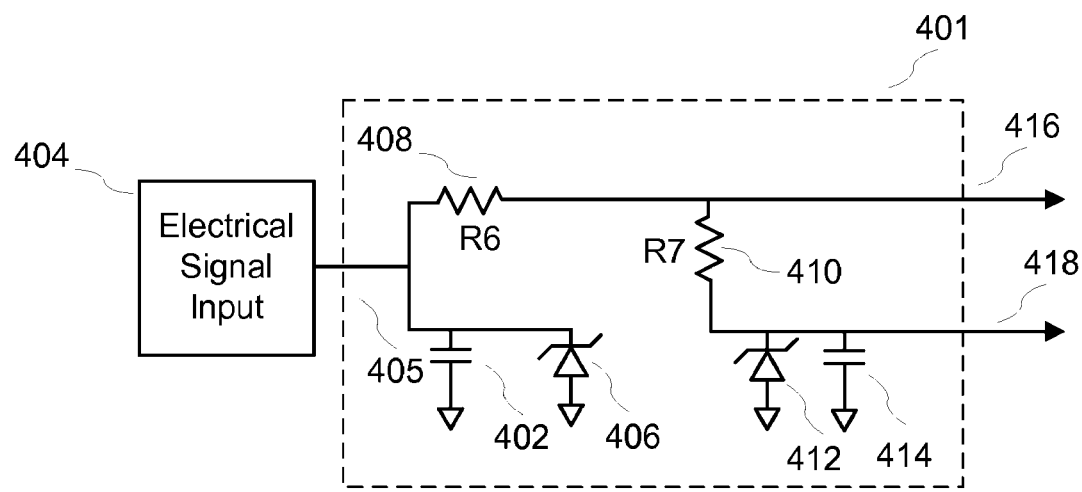
FIG. 5 illustrates a diagram of a power circuit configured to generate two power voltages for a self-powered current sensor according to an embodiment.

FIG. 5 illustrates a block diagram of a power circuit for an embodiment of a self-powered current sensor configured to generate two power voltages coupled with an electrical signal input 404. According to an embodiment, a power circuit is coupled with an electrical signal input 306, such as a coil. A power circuit 404, according to an embodiment, may include one or more of any of a first zener diode 406 and a first capacitor 402 coupled with an electrical signal input 404. For an embodiment, one or more of a first zener diode 406 is used to produce a voltage regulated around a value. For an embodiment, more than one first zener diodes 406 may be used to handle the power requirements of a power circuit. For an embodiment, a first zener diode 406 is used to produce a voltage regulated at approximately 15 volts. One skilled in the art would appreciate that one or more zener diode 314 may be used to produce any magnitude of voltage using techniques known in the art. A first capacitor 402, according to an embodiment, may be used to filter out noise or smooth out a power signal generated by power circuit 401, as discussed herein. For an embodiment, a first capacitor 402 is configured to have a value of approximately 10 microfarads. According to an embodiment more than one capacitive element may be used to form a first capacitor 402. One skilled in the art would understand that the value of a capacitor is not specifically limited to a specific value and other values could be used.

A power circuit 401, according to an embodiment, may also include one or more voltage dividers to scale an input voltage down to a desired power voltage. For an embodiment, a power circuit 401 may include a first resistor 408 coupled with an electrical signal input 404 and a second resistor 410 to form a voltage divider to generate a first power voltage 416. For such an embodiment, the first resistor 408 is configured to have a resistance value R6 and the second resistor 410 is configured to have a resistance value R7. A first resistor 408 and a second resistor 410 may be one or more resistive elements, as discussed herein. Further, the first resistor 408 and the second resistor 410 are configured to reduce an input voltage received from an electrical signal. For a specific embodiment, a first resistor 408 and a second resistor 410 may be configured to reduce a voltage of an input signal 405 received from an electrical signal input 404 by a third. For an embodiment, a first resistor 408 is configured to have a resistance value R6 approximately equal to 1 kiloohms and a second resistor 410 is configured to have resistance value R5 approximately equal to 2 kiloohms. One skilled in the art would understand that any value of resistance may be used to convert an input voltage to any desired value using techniques known in the art.

As further illustrated in FIG. 5, an embodiment includes a second resistor 410 coupled with a second zener diode 412 and a second capacitor 414. A second zener diode 412 may be configured such as others discussed herein. For an embodiment, a second zener diode 412 is further coupled with a reference voltage, such as a ground plane. Similarly, a second capacitor 414, according to an embodiment, is coupled with a reference voltage, such as a ground plane. A second capacitor 414, according to an embodiment, may be configured as other capacitors described herein. A second zener diode 412 for an embodiment is configured to produce a second power voltage 418 of approximately 5 volts. And, a second capacitor 414 is configured to have a value of 10 microfarads to reduce noise and/or smooth out a second power voltage 418, according to an embodiment. One skilled in the art would appreciate that the values of a second zener diode 412 and a second capacitor 414 may be configured to generate a magnitude of voltage and use any value of capacitance to meet design requirements and desired performance. According to an embodiment, a power circuit 401 may include any number of conditioning circuits such as those described herein.

Figure 6:
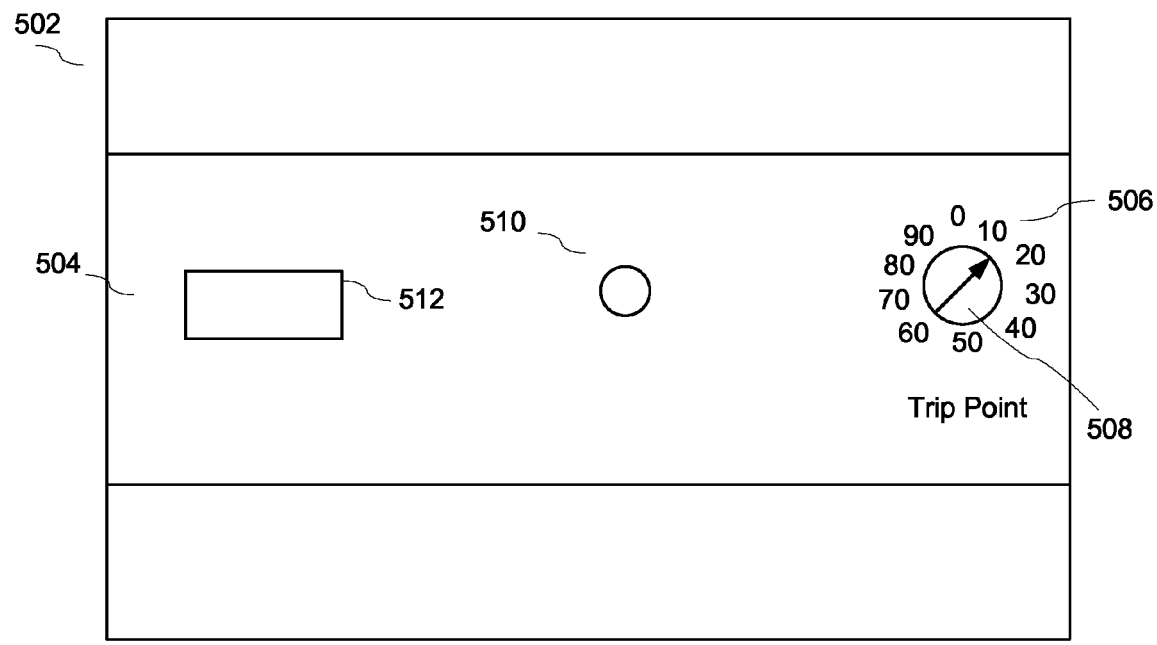
FIG. 6 illustrates a top view of a diagram of a self-powered current sensor including a configuration inputs according to an embodiment.

FIG. 6 illustrates a perspective view of a diagram of a self-powered current sensor, according to an embodiment. A current sensor 502, according to an embodiment, includes a configuration panel 504 including one or more configuration inputs for configuring the operation of a current sensor 502. A current sensor 502 includes indicators 506, according to an embodiment. According to an embodiment, a configuration panel 504 includes a configuration input such as a selector 508. A selector 508, according to an embodiment, sets a value of a configuration setting. For example, a selector 508 in the embodiment illustrated in FIG. 6 is used to set a trip-point value for an alarm. A configuration panel 504 also includes indicators 506 that correspond to a value or a setting that the selector is set to, according to an embodiment. Indicators 506 are labeled on a configuration panel 504 according to an embodiment. An indicator 506 may be any alphanumeric character that represents a value or a setting. Such an indicator 506 may be etched on, drawn on, printed on, or otherwise affixed to a current sensor 502. As such, a user would set the value by moving a selector 508 to point to the indicator of the value desired according to an embodiment. Thus, the value of a selector 508 is set and a current sensor 502 activates an alarm based on a position of a selector 408 using techniques described herein.

For an embodiment, a current sensor 502 may include an indicator 510 including, but not limited, to an LED, a lamp, or other visual indicator to indicate that the current sensor 502 is operating and/or that an alarm is activated. For an embodiment, an indicator 510 may be located on a configuration panel 504. Other embodiments, include an indicator 510 located on another location on a current sensor 502. In addition, an embodiment may include a connector 512. For an embodiment, a connector 512 may be located on a configuration panel 504. Connectors 504 include, but are not limited to, keyed connectors, terminal blocks, posts, plug and socket connectors, and other connectors for making a current connection.

Figure 7:
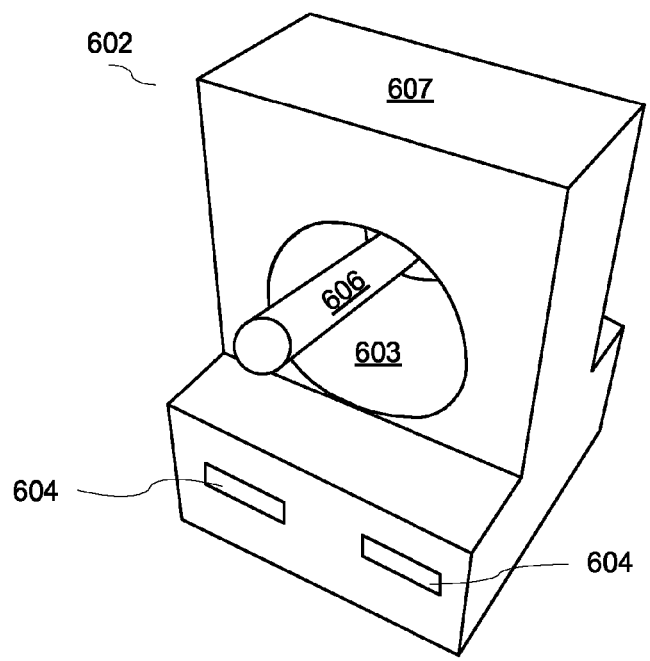
FIG. 7 illustrates a perspective view of a diagram of an self-powered electrical sensor according to an embodiment.

FIG. 7 illustrates a perspective view of a self-powered current sensor that includes a coil for measuring a current according to an embodiment. A current sensor 602, according to an embodiment includes a configuration panel 607 to set one or more configuration settings of a current sensor 602, as described herein. For an embodiment, a sensor aperture 603 is configured to accept a current conductor 606 through electrical sensor 602 to enable sensing or measuring a current in the electrical conductor 606. A current sensor 602 also includes outputs 604, such as those described herein, according to an embodiment. For an embodiment, a current sensor 602 includes one or more connectors 604 for connecting one or more outputs to other equipment such as a control system or a monitor system. A connector 604 may include, but is not limited to, those discussed herein.

Figure 8:
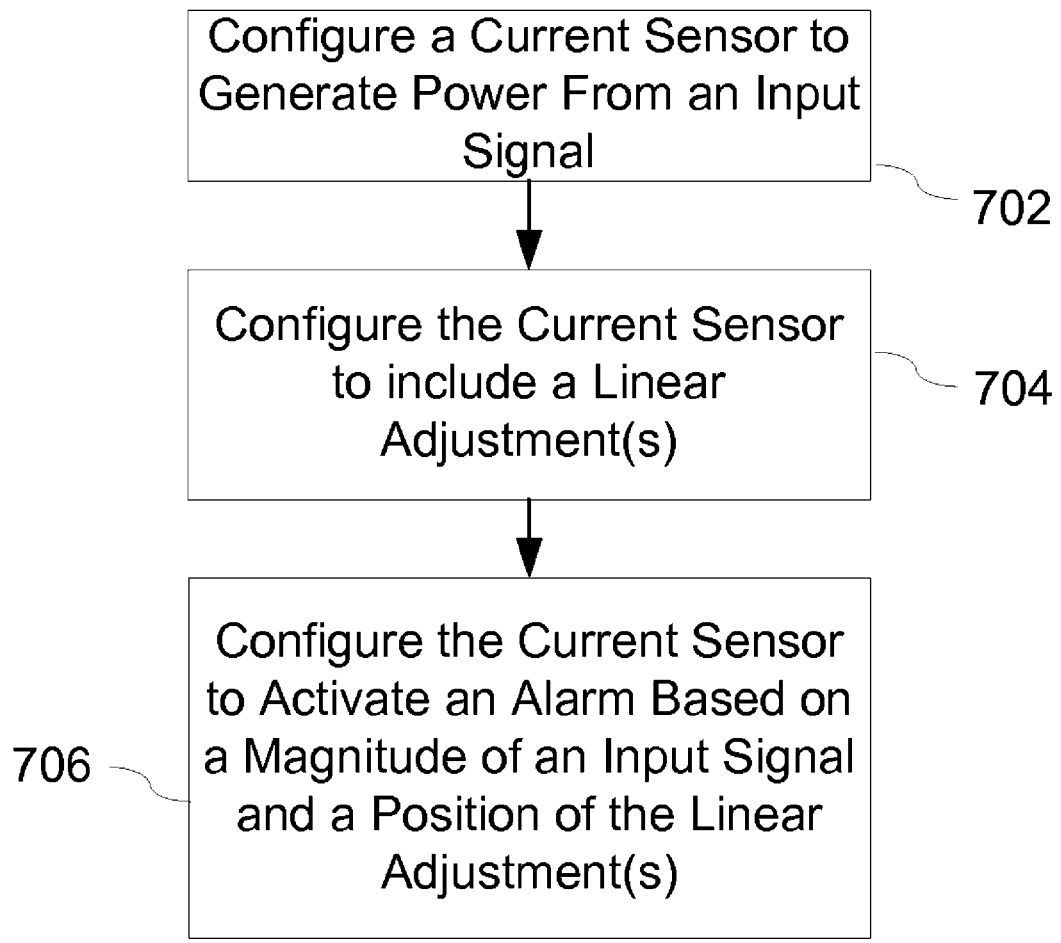
FIG. 8 is a flow diagram of a method for configuring a self-powered current sensor including a non-linear input.

FIG. 8 illustrates a flow diagram of a method for configuring a self-powered current sensor to include a linear adjustment. At block 702, the method includes configuring a current sensor to generate power from an input signal received by an electrical signal input using techniques including those described herein. The method, at block 704, includes configuring a self-powered current sensor to include a linear adjustment using techniques including those described herein. At block 706, the method configures a self-powered current sensor to activate an alarm based on a magnitude of an electrical signal and a position of one or more linear adjustments, such as a configuration setting, relative to one or more indicators as described herein. According to an embodiment, configuring a monitor includes one of or a combination of programming a processor, loading instructions or code into a processor or memory, connecting components, and otherwise arranging components.

In the foregoing specification, specific exemplary embodiments of the invention have been described. It will, however, be evident that various modifications and changes may be made thereto. The specification and drawings are, accordingly, to be regarded in an illustrative rather than a restrictive sense.

What is claimed is:

1. A self-powered current sensor comprising:
   an electrical signal input configured to receive an electrical signal;
   a power circuit configured to generate a power voltage from said electrical signal;
   a variable resistor having a counter-clockwise terminal, a wiper terminal, and a clockwise terminal, said variable resistor configured to set a value corresponding to one or more visual indicators affixed on a configuration panel of the self-powered current sensor, said counter-clockwise terminal coupled with at least one resistor;
   an amplifier having a inverting input, a non-inverting input, and an output, said amplifier coupled with said variable resistor with said counter-clockwise terminal coupled with said at least one resistor, such that said amplifier is configured as a linear adjustment, including said inverting input coupled with said wiper terminal of said variable resistor, said output coupled with said clockwise terminal of said variable resistor, said amplifier coupled with said power circuit, said amplifier configured to be powered by said power voltage generated by said power circuit; and an alarm coupled with said amplifier, said alarm configured to activate based on said value set by said variable resistor.

2. The self-powered current sensor of claim 1, wherein said power circuit is further configured to generate a second power voltage from said electrical signal.

3. The self-powered current sensor of claim 1, wherein said amplifier includes an operational amplifier.

4. The self-powered current sensor of claim 1, wherein said amplifier is configured to have a gain based on a value of said variable resistor.

5. The self-powered current sensor of claim 1, wherein said amplifier is coupled with said alarm through a conditioning circuit.

6. The self-powered current sensor of claim 5, wherein said conditioning circuit converts a voltage output from said amplifier into a second voltage proportional to said voltage output.

7. The self-powered current sensor of claim 1 further comprising a delay circuit configured to delay activation of said alarm.

8. The self-powered current sensor of claim 7, wherein said amplifier is coupled with said delay circuit and said delay circuit is configured to delay activation of said alarm for a period of time corresponding to a delay value.

9. The self-powered current sensor of claim 1, wherein said electrical signal input includes a core configured to define a sensing aperture and said core is configured to generate a current that corresponds to a characteristic of said electrical signal.

10. An apparatus for measuring one or more electrical characteristics comprising:
an electrical signal input configured to receive an electrical signal;
a power circuit configured to generate a power voltage from said electrical signal;
a variable resistor coupled with said electrical signal input, said variable resistor having a counter-clockwise terminal, a wiper terminal, and a clockwise terminal, said counter-clockwise terminal coupled with at least one resistor, and said variable resistor configured to set a value corresponding to one or more visual indicators affixed on a configuration panel of the apparatus for measuring one or more electrical characteristics;
an amplifier having a inverting input, a non-inverting input, and an output, said amplifier coupled with said electrical signal input and said power circuit, said amplifier coupled with said variable resistor with said counter-clockwise terminal coupled with said at least one resistor to configure said amplifier as a linear adjustment including said inverting input coupled with said wiper terminal of said variable resistor and said output coupled with said clockwise terminal of said variable resistor, said amplifier configured to be powered by said power voltage generated by said power circuit; and an alarm coupled with said amplifier, said alarm configured to activate based on said value set by said variable resistor.

11. The apparatus of claim 10, wherein said power circuit is further configured to generate a second power voltage from said electrical signal.

12. The apparatus of claim 10, wherein said amplifier includes an operational amplifier.

13. The apparatus of claim 10, wherein said amplifier is configured to have a gain based on a position of said variable resistor.

14. The apparatus of claim 10, wherein said amplifier is coupled with said alarm through a conditioning circuit.

15. The apparatus of claim 14, wherein said conditioning circuit converts a voltage output from said amplifier into a second voltage proportional to said voltage output.

16. The apparatus of claim 10 further comprising a delay circuit configured to delay activation of said alarm.

17. The apparatus of claim 16, wherein said amplifier is coupled with said delay circuit and said delay circuit is configured to delay activation of said alarm for a period of time corresponding to a delay value.

18. The apparatus of claim 10, wherein said electrical signal input includes a core configured to define a sensing aperture and said core is configured to generate a current that corresponds to a characteristic of said electrical signal.

19. A method comprising:
configuring a self-powered current sensor to generate power from an input signal received by an electrical signal input;
configuring said self-powered current sensor to include a linear adjustment including an amplifier having a inverting input, a non-inverting input, and an output and a variable resistor having a counter-clockwise terminal, a wiper terminal, and a clockwise terminal such that said inverting input is coupled with said wiper terminal of said variable resistor, said output is coupled with said clockwise terminal of said variable resistor, and said counter-clockwise terminal is coupled with at least one resistor, said amplifier configured to be powered by said power generated; and
configuring said self-power current sensor to activate an alarm based on a magnitude of said input signal and a position of said linear adjustment relative to a visual indicator affixed on a configuration panel of said self-powered current sensor.

* * * * *